(12) United States Patent
Nguyen

(10) Patent No.: US 6,373,308 B1
(45) Date of Patent: Apr. 16, 2002

(54) DIRECT-MEASURED DLL CIRCUIT AND METHOD

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/755,671

(22) Filed: Jan. 5, 2001

Related U.S. Application Data (63) Continuation-in-part of application No. 09/493,858, filed on Jan. 28, 2000, now Pat. No. 6,255,880, which is a continuation-in-part of application No. 09/427,143, filed on Oct. 25, 1999, now Pat. No. 6,285,226.

(51) Int. Cl.[7] ............................... H03L 7/00
(52) U.S. Cl. ................ 327/161; 327/150; 327/158; 327/276; 375/362; 365/233
(58) Field of Search .................. 327/261, 269, 327/271, 276, 277, 284, 291, 298, 141, 144, 146, 152, 153, 155, 158, 159, 161, 150; 375/371, 373, 362; 365/233, 233.5; 331/DIG. 2, 1 A (56) References Cited

U.S. PATENT DOCUMENTS

| | | | |
|---|---|---|---|
| 5,245,637 A | 9/1993 | Gersbach et al. | 375/374 |
| 5,329,188 A * | 7/1994 | Sikkink et al. | 327/18 |
| 5,537,069 A | 7/1996 | Volk | 327/149 |
| 5,994,938 A | 11/1999 | Lesmeister | 327/277 |
| 6,040,726 A * | 3/2000 | Martin | 327/175 |
| 6,100,735 A | 8/2000 | Lu | 327/158 |

OTHER PUBLICATIONS

Xilinx Application Note, "Using the Virtex Delay—Locked Loop", XAPP132, Oct. 21, 1998 (Version 1.31).

\* cited by examiner

Primary Examiner—Kenneth B. Wells
Assistant Examiner—Minh Nguyen
(74) Attorney, Agent, or Firm—Lois D. Cartier (57) ABSTRACT

A delay-lock loop (DLL) circuit and method that accept an input clock signal and a feedback clock signal, and provide the necessary additional delay to synchronize the feedback clock signal to the input clock signal. A single synchronization step is sufficient, provided that the frequency of the input clock signal is stable. Further, only one delay line is required to implement the DLL circuit. Therefore, the DLL of the present invention is both quick to "lock in" a clock signal and efficient in the use of hardware resources. Further, the present DLL is very accurate, because the same delay line is used to calculate the necessary additional delay and to generate the output clock signal.

11 Claims, 6 Drawing Sheets

DIRECT-MEASURED DLL CIRCUIT AND METHOD

CROSS-REFERENCE TO RELATED APPLICATIONS

This application is a continuation-in-part application of commonly assigned, U.S. patent application Ser. No. 09/493,858, invented by Andy T. Nguyen, entitled "ONE-SHOT DLL CIRCUIT AND METHOD" and filed Jan. 28, 2000, now U.S. Pat. No: 6,255,880 which is a continuation-in-part application of commonly assigned, co-pending U.S. patent application Ser. No. 09/427,143 invented by Andy T. Nguyen, entitled "DUTY CYCLE CORRECTION CIRCUIT AND METHOD" and filed Oct. 25, 1999, now U.S. Pat. No. 6,285,226 both of which are incorporated herein by reference.

FIELD OF THE INVENTION

The invention relates to integrated circuits (ICs). More particularly, the invention relates to a delay-lock loop (DLL) circuit and method for an IC.

BACKGROUND OF THE INVENTION

Clock signals are used in virtually every IC and electronic system to control timing. For example, every time there is a rising edge on a clock signal, all the flip-flops in a circuit may change state. Clearly, clocks are often heavily loaded signals, and may be bussed throughout a very large IC. Even with specially-designed global buffers, there is typically a delay between the clock edge received by the IC at the pad, and the clock edge received by the last-served flip-flop on the IC (i.e., between the "input clock signal" and the "destination clock signal"). This delay, designated herein as $t_d$, may cause difficulties in interfacing between ICs, or simply slow down the overall system speed. Input data may be provided in synchronization with the input clock signal, while output data is typically provided in synchronization with the destination clock signal. Further, $t_d$ often varies not only between different ICs, but on a single IC with temperature and voltage as well. It is highly desirable to have a circuit and method for synchronizing a destination clock signal with an input clock signal, so that the destination clock signals of various ICs can be commonly synchronized by synchronizing each destination clock signal to a common input clock signal.

This clock synchronization procedure is often performed using a phase-lock loop (PLL) or delay-lock loop (DLL). However, known PLLs and DLLs consume a great deal of silicon area. Additionally, PLLs are often analog in nature and take an extremely long time to simulate, and a design that works in one manufacturing process may stop working when manufactured using another process. Further, analog PLLS can be particularly sensitive to radiation. Therefore, PLLs are very difficult to design, and often are not feasible in a given circuit or system. Known DLLs are also very complicated and difficult to design. Further, known DLLs require many input clock cycles to "lock", i.e., to synchronize a destination clock signal to an input clock signal. As described below, known DLLs also typically run continuously during the entire time the two clock signals must be synchronized, frequently adjusting the destination clock signal to keep it properly synchronized. This constant adjustment not only requires a large and complicated state machine, it also injects a lot of noise into the clock network. Because a noisy clock signal can cause enormous problems in a sensitive IC circuit, a large stabilizing capacitor is often required between the positive power supply (VDD) and the zero voltage level (ground). For one or more of these reasons, clock synchronization is often not feasible using known circuits and methods.

Therefore, it is desirable to provide a delay-lock loop circuit and method using a fairly simple circuit that consumes a relatively small amount of silicon area and locks in a few clock cycles.

SUMMARY OF THE INVENTION

The invention provides a delay-lock loop (DLL) circuit and method that accept an input clock signal and a feedback clock signal, and provide the necessary additional delay to synchronize the feedback clock signal to the input clock signal. A single synchronization step is sufficient, provided that the frequency of the input clock signal is stable. Further, only one delay line is required to implement the DLL circuit. Therefore, the DLL of the present invention is both quick to "lock in" a clock signal and efficient in the use of hardware resources. Further, the present DLL is very accurate, because the same delay line is used to calculate the necessary additional delay and to generate the output clock signal.

A circuit according to the invention includes an input clock terminal supplying an input clock signal, a feedback clock terminal supplying a feedback clock signal, a delay line, and a control circuit controlling access from the input clock terminal and the feedback clock terminal to the delay line. The DLL has two modes. In the first ("or counting") mode, the delay line supplies to a decoder circuit a first plurality of intermediate clock signals delayed from the feedback clock signal by incremental unit delays. In the second ("or operating") mode, the value provided to the decoder circuit in the first mode is latched, while the delay line supplies to a clock multiplexer a second plurality of intermediate clock signals delayed from the input clock signal by incremental unit delays. The clock multiplexer uses the latched decoder circuit value to select from among the second intermediate clock signals the clock signal that provides the necessary additional delay to synchronize the feedback clock signal to the input clock signal, i.e., the clock signal subject to a delay about equal to (e.g., closest to but not exceeding) the delay needed to bring a first (e.g., rising) edge of the feedback clock signal into synchronization with the same (e.g., rising) edge of the input clock signal. The output clock signal from the clock multiplexer is distributed through the clock network to provide the distributed clock signal as well as the feedback clock signal. (In another embodiment, the intermediate clock signal selected by the clock multiplexer is the intermediate clock signal subject to a delay closest to and exceeding the delay needed to synchronize the feedback and input clock signals.)

The decoder circuit essentially counts the number of unit delays between a first (e.g., rising) edge of the feedback clock signal and the same (e.g., rising) edge of the input clock signal. This delay period is the additional delay that must be added by the DLL to bring the two clocks into synchronization. This number is then used to select the correct intermediate clock signal.

An advantage of the invention is that once the two clocks are synchronized, they need not be resynchronized unless the frequency of the input clock signal changes. Although the feedback clock signal may not be exactly synchronized to the input clock signal (the degree of accuracy depending on the granularity of the unit delay compared to the measured delay), the offset between the two clock signals does not change with time, and no subsequent adjustments need be made, as with prior art DLL circuits. Therefore, the circuit and method of the invention inject significantly less noise into the IC than known methods. Further, this "one-shot" capability (i.e., the ability to synchronize the two clocks in a single synchronization step) means that the circuit of the invention is much easier to simulate, and thus to design, than known DLL circuits.

Another advantage of the invention is that the circuit is smaller and therefore less expensive to implement than known DLL circuits, because no large state machine is required. Therefore, using the DLL circuit of the invention, clock synchronization capability can be added to smaller and less expensive ICs than was previously feasible. Further, only one delay line is required to implement the circuit, thereby both reducing the size of the circuit and ensuring exact matching of unit delays between the "counting" phase (the first mode) and the "operating" phase (the second mode).

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Figure 1A:
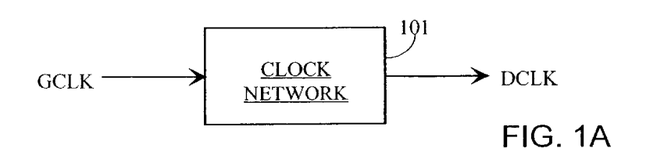
FIG. 1A is a simple block diagram of a global clock network, showing the input and output signals.
Figure 1B:
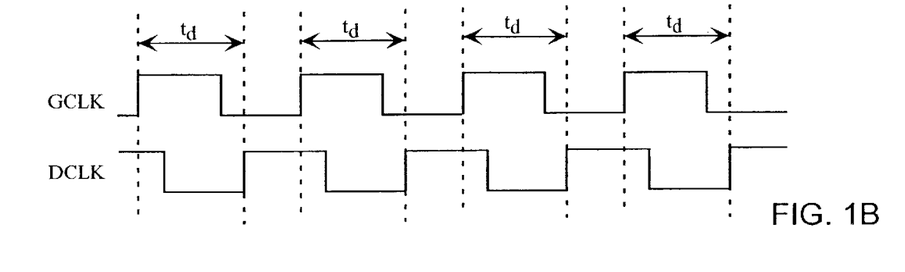
FIG. 1B is a timing diagram showing the interrelationship between the input and output signals of the global clock network of FIG. 1A.

In the following description, numerous specific details are set forth to provide a more thorough understanding of the present invention. However, it will be apparent to one skilled in the art that the present invention may be practiced without these specific details.
Clock Network Delay FIG. 1A is a simple block diagram of a clock network 101 having an intrinsic delay, the diagram showing the input clock terminal GCLK and the output clock terminal DCLK. FIG. 1B shows the corresponding signals. (In the present specification, the same reference characters are used to refer to terminals, signal lines, and their corresponding signals.) As shown in FIG. 1B, the output clock signal DCLK has a frequency the same as that of the input clock signal GCLK, but delayed by a time $t_d$.

Figure 2A:
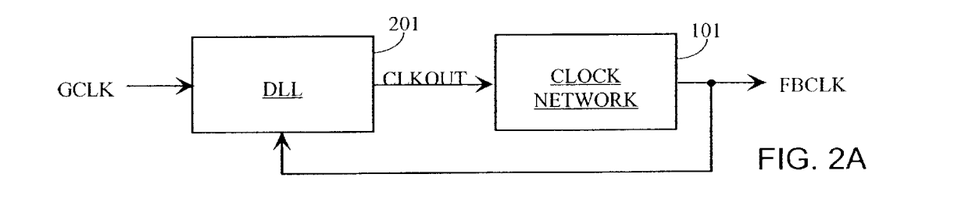
FIG. 2A is a simple block diagram showing how a DLL circuit is used to synchronize two clock signals, showing the input and output signals.
Figure 2B:
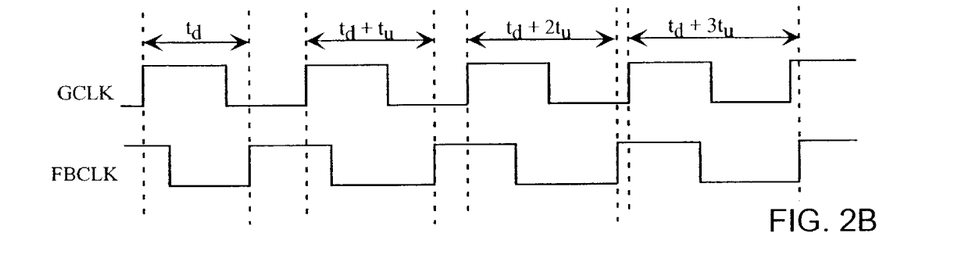
FIG. 2B is a timing diagram showing the interrelationships among the input and output signals when a prior art circuit and method are used to implement the DLL circuit of FIG. 2A.

Note that FIG. 1B shows the rising edge of the DCLK signal occurring within the second half of the input clock period. Alternatively, the rising edge of the DCLK signal may occur during the first half of the input clock period, or the clock network delay may be longer than the input clock period, such that the rising edge of the DCLK signal occurs in either half of a subsequent input clock period, or simultaneously with a GCLK edge. The case where the rising edge of the DCLK signal occurs in the second half of the same input clock period is depicted herein in each of the figures, for consistency. It is understood that the other examples mentioned may be extrapolated from the pictured examples.
Prior Art DLLs FIG. 2A is a simple block diagram of a DLL circuit 201 and a clock network 101, the DLL being driven by both the input clock signal GCLK and the feedback clock FBCLK provided by the clock network 101. FIG. 2B shows the corresponding signals for a prior art DLL. (Note that FIG. 2B has been simplified as described below, for clarity.) During the first input clock cycle shown, feedback clock signal FBCLK is delayed from input clock signal GCLK by a time $t_d$. During the second input clock cycle shown, feedback clock signal FBCLK has been altered, such that it is delayed from input clock signal GCLK by a time $t_d$ plus a single unit delay $t_u$. During the third input clock cycle shown, feedback clock signal FBCLK has been delayed from input clock signal GCLK by a time $t_d$ plus two unit delays, or $2t_u$. During the fourth input clock cycle shown, feedback clock signal FBCLK has been delayed from input clock signal GCLK by a time $t_d+3t_u$. Because the DLL circuit has "overshot its target", in a fifth input clock cycle (not shown) the delay on feedback clock signal FBCLK will be reduced to $t_d+2t_u$, then returned to $t_d+3t_u$, back to $t_d+2t_u$, and so forth in a continual adjustment process.

This adjustment process actually takes much longer than is shown in FIG. 2B. A typical DLL takes sufficiently long to determine the appropriate adjustment that many "extra" clock cycles are inserted between each adjustment. For example, it may take six clock cycles to perform an adjustment. Thus, only one unit delay can be added or subtracted for each six clock cycles. These extra clock periods have been omitted from FIG. 2B, for clarity.

Figure 2C:
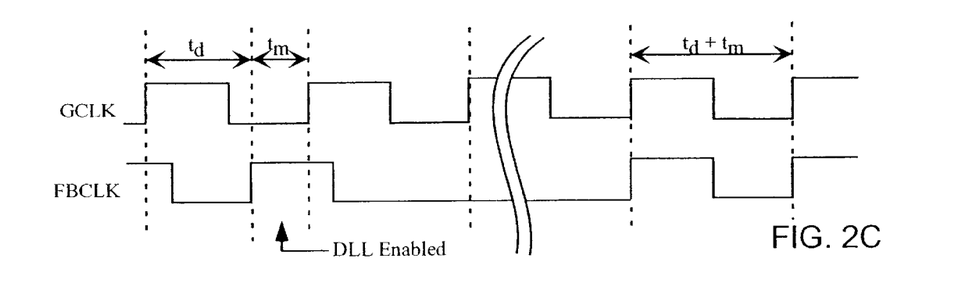
FIG. 2C is a timing diagram showing the interrelationships among the input and output signals when the circuit and method of the invention are used to implement the DLL circuit of FIG. 2A.

Clearly, obtaining the correct adjustment for a feedback clock can be a time-consuming (or even perpetual) process, using known methods.
DLLs According to the Invention FIG. 2C shows the same signals as in FIG. 2B, but for a DLL implemented according to the circuit and method of the invention. During the first input clock cycle shown, feedback clock signal FBCLK is delayed from input clock signal GCLK by a time $t_d$. During this clock cycle, the DLL is disabled. When the DLL is enabled (for example, at the time indicated by an arrow in FIG. 2C), the DLL output clock signal CLKOUT completes its current clock cycle, then is temporarily held to an inactive state (e.g., low), and the feedback clock signal FBCLK ceases to oscillate. After a predetermined number of clock cycles (e.g., 10), the CLKOUT and FBCLK signals once more begin to oscillate, with the clock edges of the feedback clock signal now being adjusted to match the clock edges of the input clock signal.

For example, in the timing diagram of FIG. 2C, $t_m$ is the number of unit delays that need to be added to the feedback clock signal FBCLK to synchronize the feedback clock with the global lock GCLK. (If the clocks are the same as in FIG. 2B, then $t_m=2t_u$.) During the final input clock cycle shown, feedback clock signal FBCLK has been altered, such that it is delayed from input lock signal GCLK by a time $t_d+t_m$. During subsequent input clock cycles, feedback clock signal FBCLK does not alter; it has been "locked". No continual adjustment process is needed.

Figure 3:
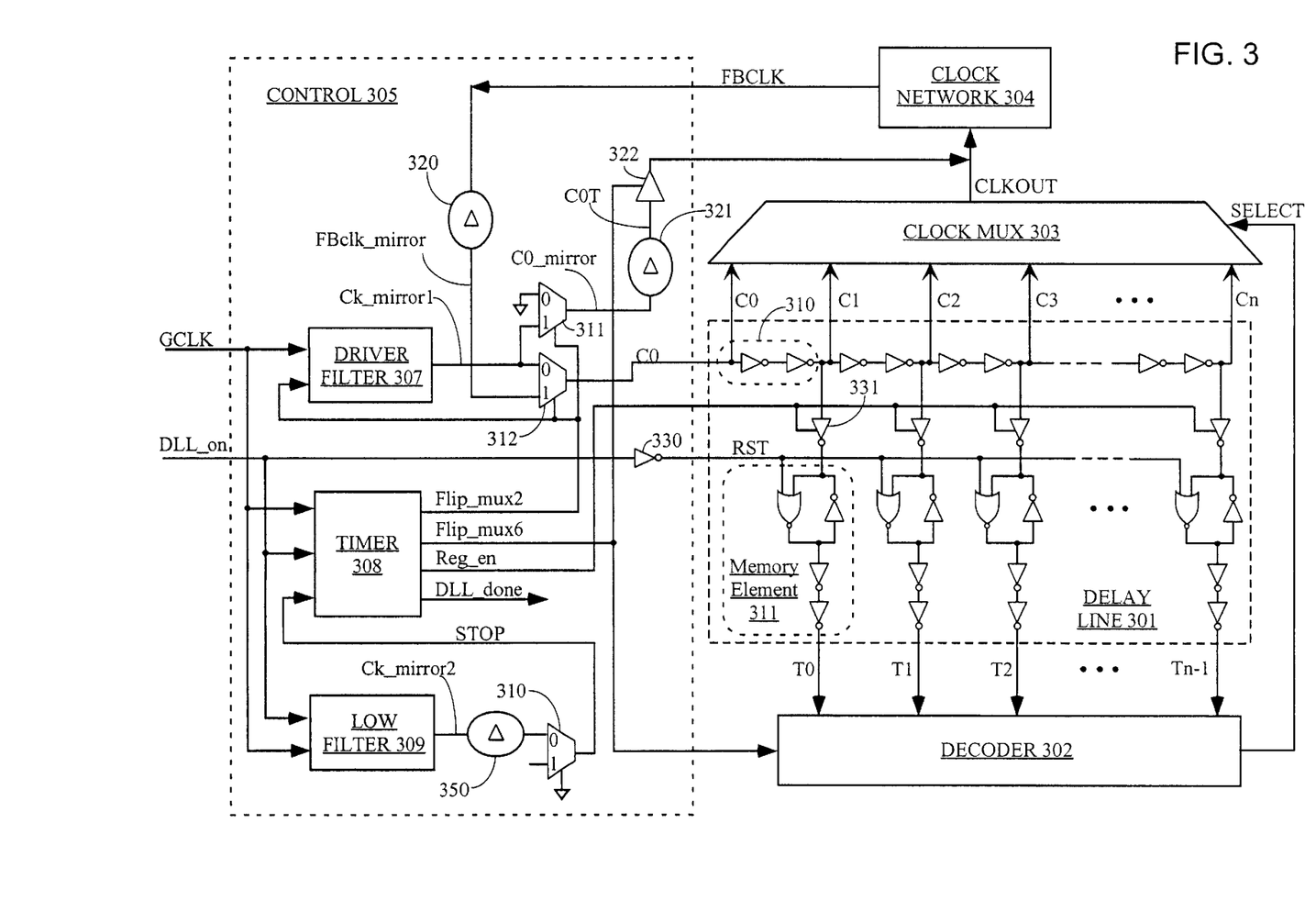
FIG. 3 is a block diagram of one embodiment of the invention.
Figure 4:
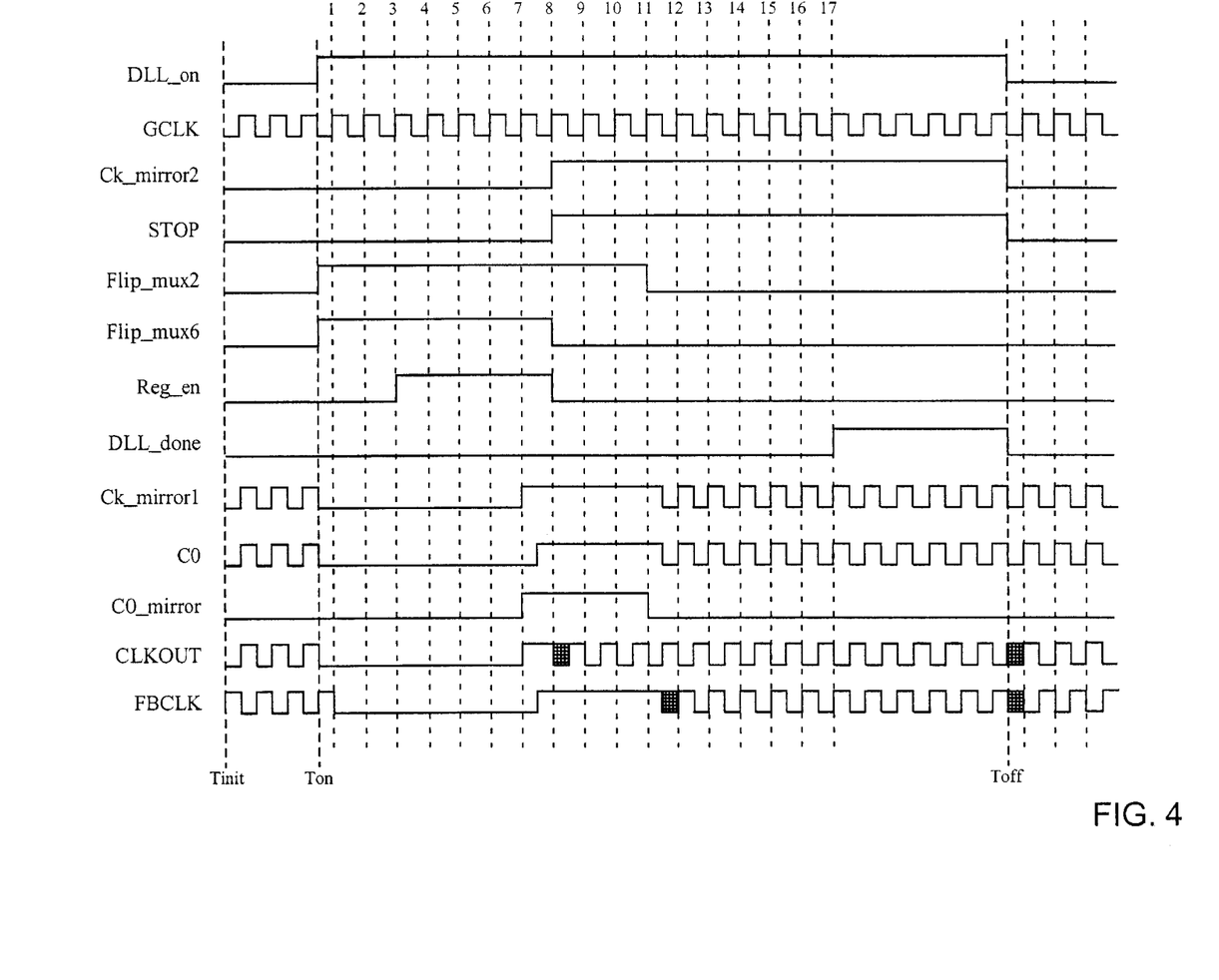
FIG. 4 is a timing diagram illustrating the functionality of the embodiment of FIG. 3.

A more detailed timing diagram is provided in FIG. 4, and is described in conjunction with the embodiment of FIG. 3.

Detailed Embodiment

FIG. 3 shows a block diagram of a DLL circuit according to one embodiment of the invention. The DLL circuit of FIG. 3 includes a delay line 301, a decoder circuit 302, a clock multiplexer 303, a clock network 304 (generally located external to the DLL, but included in FIG. 3 for clarity), and a control circuit 305.

Clock network 304 provides a feedback clock signal FBCLK that drives both control circuit 305 and other circuits in the IC.

Delay line 301 is driven by control circuit 305, which provides to the delay line a signal C0 derived either from feedback clock signal FBCLK (in a first mode) or from input clock signal GCLK (in a second mode). Delay line 305 comprises a series of delay elements 310, each having a delay of one "unit delay". A unit delay can be any period of time appropriate to the application of the DLL circuit. For example, a unit delay can be measured in tens, hundreds, or thousands of picoseconds, or even longer periods of time, particularly for non-IC applications. Delay line 301 provides a plurality of intermediate clock signals, respectively delayed by 0, 1, ..., n unit delays from the signal C0. Thus, delay line 301 provides from signal C0 a first plurality of intermediate clock signals (T0, T1, ..., Tn−1) to decoder circuit 302, and a second plurality of intermediate clock signals (C0, C1, ..., Cn) to clock multiplexer 303.

In the pictured embodiment, the first plurality of intermediate clock signals are stored (e.g., latched) in a series of memory elements 311.

Decoder circuit 302 uses the stored first intermediate clock signals to "count" the number of unit delays between a rising edge of the feedback clock signal FBCLK and the following rising edge of the input clock signal GCLK. Decoder circuit 302 then uses this counted number of unit delays to control the clock multiplexer. For example, referring to FIG. 2C, decoder circuit 302 determines the number of unit delays in time interval $t_m$. Clock multiplexer 303 selects one of the second intermediate clock signals derived from input clock signal GCLK and provides the selected signal as signal CLKOUT to clock network 304.

Clock multiplexer 303 (under control of decoder circuit 302) selects the intermediate clock signal subject to the necessary additional delay to synchronize feedback clock signal FBCLK to input clock signal GCLK, i.e., the intermediate clock signal subject to a delay closest to but not exceeding the delay needed to bring a first (e.g., rising) edge of the feedback clock signal into synchronization with the same (e.g., rising) edge of the input clock signal. This counting and selection process is controlled by control circuit 305.

FIG. 3 pictures one embodiment of control circuit 305. However, it will be clear to those of ordinary skill in the art that the DLL of the invention can be implemented using other control circuits. Provided that the control circuit functions substantially as described above, the implementation of control circuit 305 can vary, and such variations fall within the scope of the present invention.

In the embodiment of FIG. 3, control circuit 305 includes driver filter 307, timer circuit 308, low filter 309, multiplexers 310–312, delay matching circuits 320–321, tristate buffer 322, and inverter 330.

Delay matching element 350 and multiplexer 310 are provided between the CK_mirror2 signal and the STOP signal to match the loading between signals CK_mirror2 and CK_mirror1. Delay matching circuit 320 is provided between signals FBCLK and FBclk_mirror to match the delay and loading between signals FBclk_mirror and CK_mirror1. Delay matching circuit 321 is provided between signals C0_mirror and C0T to match the delay and loading between signals C0_mirror and C0. In other embodiments, other delay matching techniques can be used to match the signal characteristics of the three signals FBclk_mirror, CK_mirror1, and CK_mirror2, and to match the signal characteristics of the two signals C0 and C0_mirror.

Figure 5:
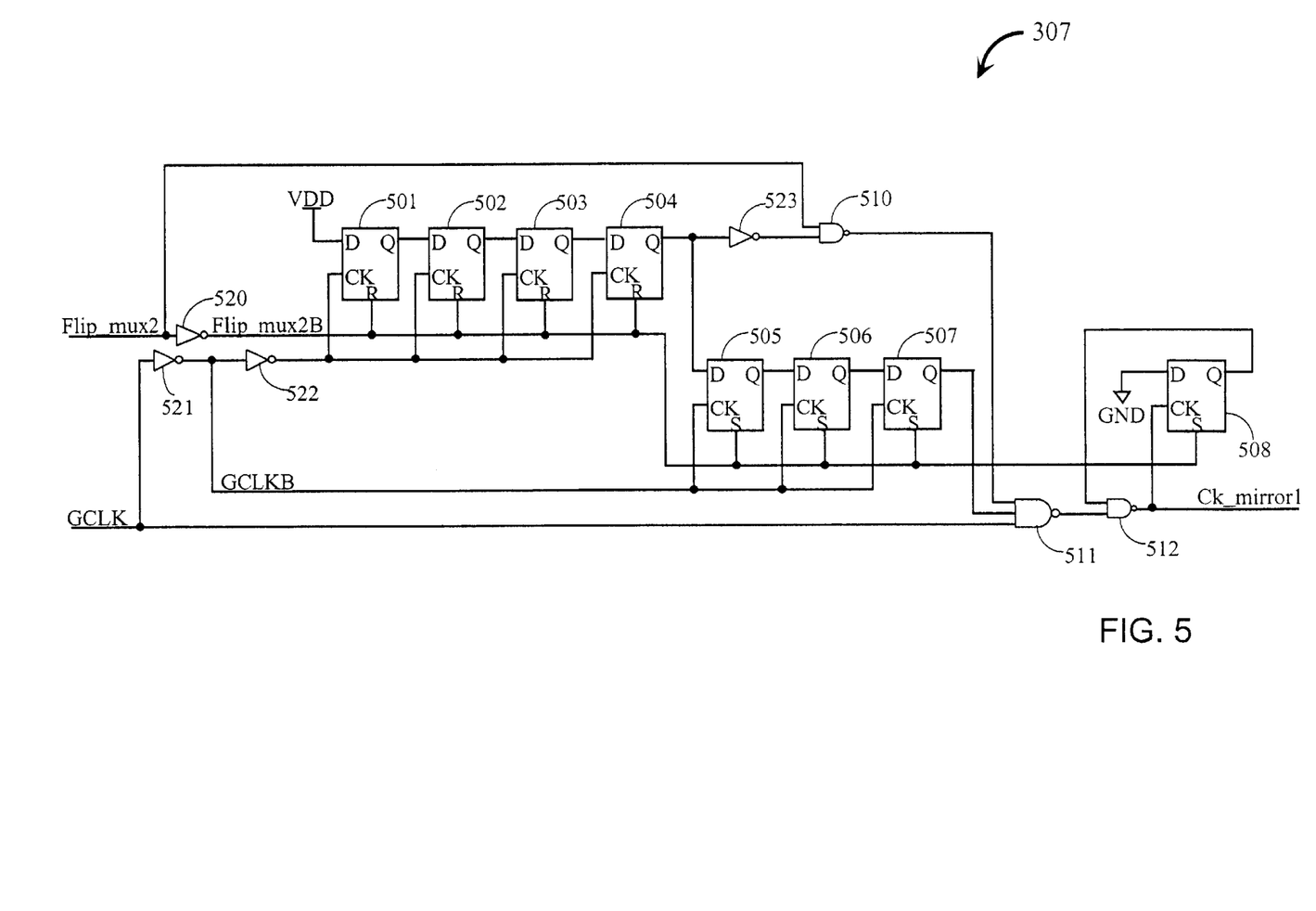
FIG. 5 is a block diagram of a driver filter circuit that can be used with the embodiment of FIG. 3.

Driver filter 307 behaves as follows. If signal Flip_mux2 is low, then the output (CK_mirror1) of the driver filter echoes the input signal (GCLK). If signal Flip_mux2 is high, then after a first predetermined number of clock cycles, the output (CK_mirror1) of the driver filter goes from low to high, then stays high. Therefore, driver filter 307 behaves either as a driver circuit (if Flip_mux2 is low), or as a 1-edge filter with a delay of N clock cycles (if Flip_mux2 is high). One implementation of driver filter 307 is shown in FIG. 5 and is described below with reference to that figure.

Figure 6:
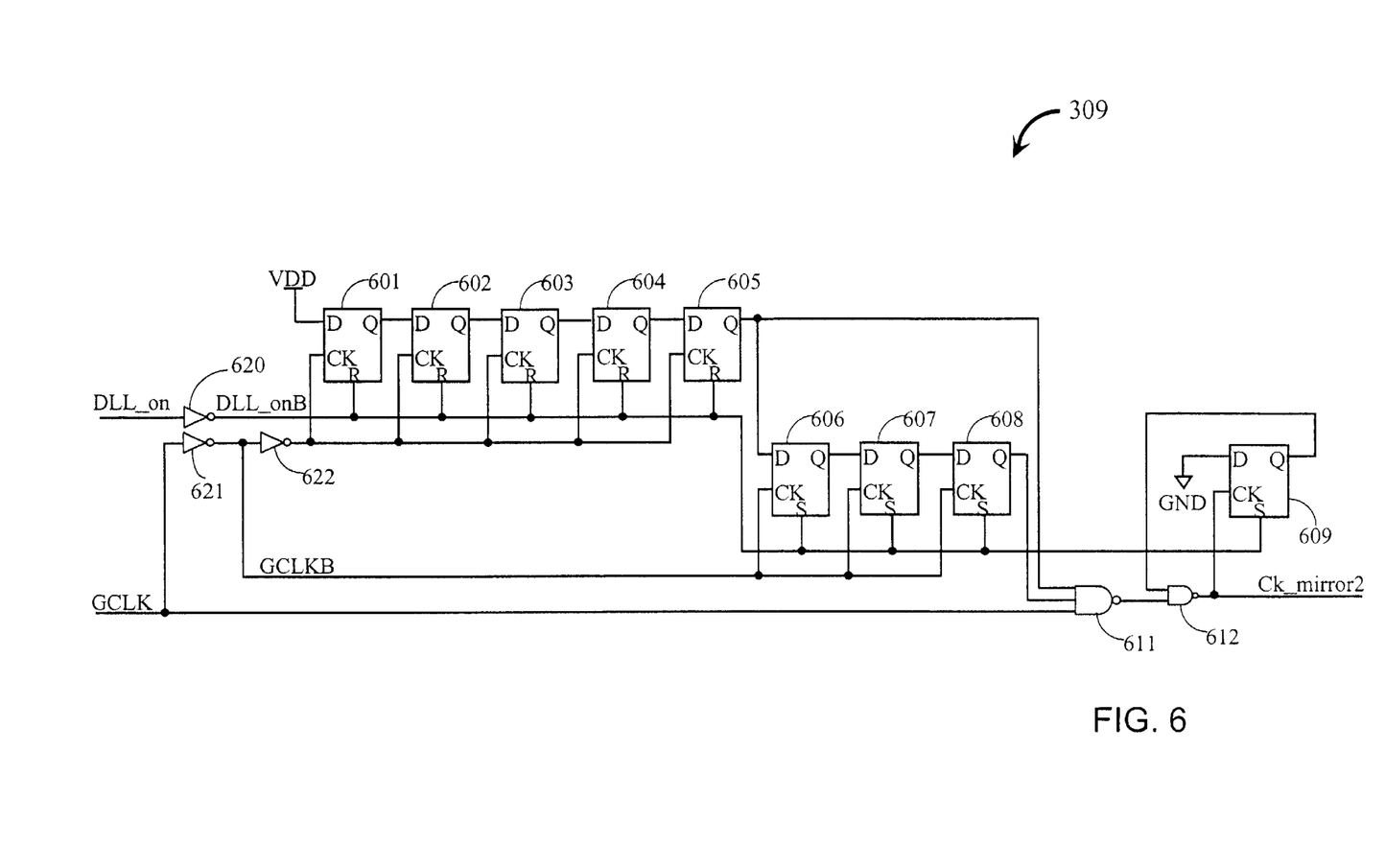
FIG. 6 is a block diagram of a low filter circuit that can be used with the embodiment of FIG. 3.

Low filter 309 behaves as follows. If signal DLL_on is low, then the output (CK_mirror2) of the driver filter is low. If signal DLL_on is high, then after a second predetermined number of clock cycles that is one more than the first predetermined number of clock cycles, the output (CK_mirror2) of the driver filter 309 goes from low to high, then stays high. Therefore, low filter behaves either as connection to ground (if DLL_on is low), or as a 1-edge filter with a delay of N+1 clock cycles (if DLL_on is high). One implementation of low filter 309 is shown in FIG. 6 and is described below with reference to that figure.

Figure 7:
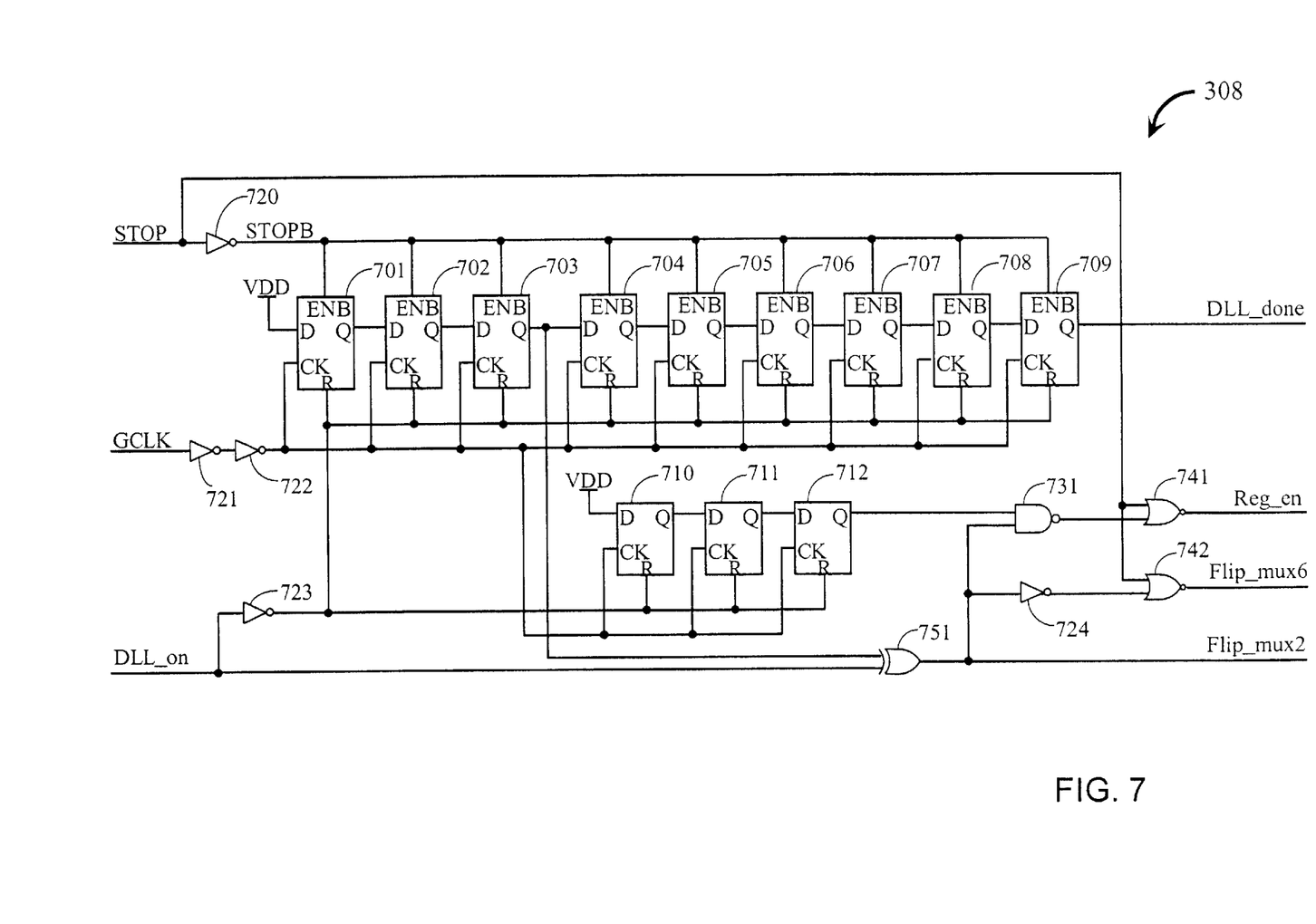
FIG. 7 is a block diagram of a timer circuit that can be used with the embodiment of FIG. 3.

Timer circuit 308 is a state machine that generates control signals Flip_mux2, Flip-mux6, Reg_en, and DLL_done in a predetermined sequence and with predetermined timing. One implementation of timer circuit 308 is shown in FIG. 7 and is described below with reference to that figure. The predetermined sequence and predetermined timing of control signals Flip_mux2, Flip-mux6, Reg_en, and DLL_done are shown in FIG. 4.

Signals Reg_en and DLL_on (inverted by inverter 330) control delay line 301 as follows. If DLL_on is low, then the reset signal RST is high, and the outputs of all memory elements 311 (T0, T1, ..., Tn−1) are low. If DLL_on is high, then the reset signal RST is low, and the memory elements function as latches. If Reg_en is high, then inverting tristate buffers 331 are active (i.e., driving), and the latches hold the current signals (C1, C2, ..., Cn) from the delay elements 310; i.e., the latches can receive new data. If Reg_en is low, then tristate buffers 331 are tristated, and the previous signals from the delay elements 310 are latched.

Signal Flip_mux6 controls decoder circuit 302 as follows. If Flip_mux6 is high, decoder circuit 302 generates output signals (SELECT) that tristate the clock multiplexer 303. If Flip_mux6 is low, the decoder circuit generates output signals (SELECT) that enable clock multiplexer 303 to select the appropriate intermediate clock signal. For example, if all of signals T0, T1, ..., Tn−1 are low, then clock multiplexer 303 selects the C0 intermediate clock signal. If T<0:n−1> is 1110000000 ... 0, then intermediate clock signal C3 is selected because there are three high signals. The decoder circuit follows this pattern, thereby essentially "counting" the number of high signals in latched clock signals T0, T1, ..., Tn−1 and using this number to select the appropriate clock signal.

Timing Diagram

The functionality of the DLL circuit of FIG. 3 is now described with reference to the timing diagram of FIG. 4.

Initially, at time Tinit, the DLL is disabled, i.e., signal DLL_on is low. DLL control signals Flip_mux2, Flip_mux6, Reg_en, and DLL_done are all low, as are signals CK_mirror2, STOP, and T<0:n−1>. Therefore, the DLL input clock signal GCLK is routed through driver filter 307 to signal CK_mirror1, which therefore follows signal GCLK, as shown in FIG. 4. Signal CK_mirror1 is selected by multiplexer 312 (because control signal Flip_mux2 is low) and is provided to delay line 301 as signal C0. Because control signal Flip_mux6 is low, decoder circuit 302 provides SELECT control signals that enable clock multiplexer 303 to select the C0 intermediate clock signal, as described above. However, the C0 signal follows DLL input clock signal GCLK, as described. Therefore, DLL output clock signal CLKOUT follows DLL input clock signal GCLK, as shown in FIG. 4. Also, because control signal Flip_mux6 is low, tristate buffer 322 is tristated, and no contention for signal CLKOUT is provided by tristate buffer 322. Feedback clock signal FBCLK also follows DLL output clock signal CLKOUT, but with a delay inserted by clock network 304.

Also at time Tinit, because signal Reg_en is low, inverting tristate buffers 331 are tristated, and memory elements 311 are all latched. Because reset signal RST is high (DLL_on is low), the memory elements 311 are all holding "zero" values.

At time Ton, the DLL is enabled, i.e., signal DLL_on goes high, and a series of operations occur in sequence, as illustrated in FIG. 4.

At time Ton, control signals Flip_mux2 and Flip_mux6 go high, Ck_mirror1 goes low, and CK_mirror2 remains low. Because signal Flip_mux2 is high, multiplexer 311 selects signal Ck_mirror1 to drive signal C0_mirror. Because signal Flip_mux6 is high, tristate buffer 322 is not tristated, and signal C0_mirror drives signal CLKOUT through delay matching circuit 321. Therefore, driver filter 307 provides the clock output signal CLKOUT, which bypasses delay line 301 and clock multiplexer 303. Thus, delay line 301 is free to perform another function: to count the number of unit delays between two clock edges.

Signal C0 to the delay line 301 is now provided by the feedback clock signal FBCLK, routed through delay matching circuit 320 and multiplexer 312. Because signals Ck_mirror1 and Ck_mirror2 are low, signals C0, CLKOUT, FBCLK, and STOP all go low or remain low.

At the third input clock cycle after Ton (indicated by the number "3" in FIG. 4), timer circuit 308 drives Reg_en high, and inverted tristate buffers 331 begin to drive memory elements 311. Thus, memory elements 311 receive the current values of C1, C2, . . . , Cn. All of C1, C2, . . . , Cn are low; therefore, the values in memory elements 311 do not change at this time.

At the seventh input clock cycle ("7" in FIG. 4), signal CK_mirror1 goes high and remains high. (As described above, driver filter 307 is designed such that when signal Flip_mux2 goes high, the output of the driver filter goes high after a predetermined number of clock cycles and then remains high.) Therefore, signals CLKOUT, FBCLK, and C0 also go high. There is an appreciable delay (the delay through clock network 304) before signals FBCLK and C0 go high, as shown in FIG. 4. when signal C0 goes high, signals C1, C2, and so forth will also go high in sequence, as the low-to-high transition on signal C0 moves to the right along delay line 301. However, not all of signals C1, C2, . . . , Cn go high, because the next step (at time "8") stops the series of transitions using the STOP signal.

At the eighth input clock cycle ("8" in FIG. 4), signal CK_mirror2 goes high and remains high. (As described above, low filter 309 is designed such that the output goes high one clock cycle after the driver filter output goes high, and then remains high.) Signal STOP consequently goes high also, and in response, timer circuit 308 causes control signals Flip_mux6 and Reg_en to go low. When Reg_en goes low, inverted tristate buffers 331 are all tristated, which latches the current values of C1, C2, . . . , Cn into memory elements 311. At this time, the contents of memory elements 311 are a series of ones followed by a series of zeros. The number of ones is the number of unit delays between a rising edge on C0 (which mirrors FBCLK) and a rising edge on STOP (which is triggered by a rising edge on GCLK). Therefore, the number of ones is the number of unit delays between the rising edge of signal FBCLK and the next rising edge of signal GCLK. Referring to FIG. 2C, the number of ones is the number of unit delays that need to be added to the feedback clock signal FBCLK to synchronize the feedback clock with the input clock GCLK.

Now that the necessary number of delays has been counted, it is necessary to select the correct intermediate clock signal to synchronize the two clock signals. The correct intermediate clock signal is selected in response to the Flip_mux6 signal going high at the eighth memory cycle. When signal Flip_mux6 goes high, tristate buffer 322 is tristated, and the CLKOUT signal is no longer supplied by the tristate buffer. Instead, signal Flip_mux6 going high also enables decoder circuit 302, which decodes the series of ones and zeros from memory elements 311. The decoded value is then used to control clock multiplexer 303 to select the correct intermediate clock signal to drive CLKOUT.

However, in order to complete the transition from the first (or "counting") mode of the DLL to the second (or "operating") mode, the input to the delay line must be changed. The input signal driving the delay line is controlled by the Flip_mux2 signal, and at the eighth clock cycle, the Flip_mux2 signal is still high.

At the eleventh input clock cycle ("11" in FIG. 4), the Flip_mux2 signal is reset to zero to flip the delay line input from the delayed feedback clock (FBclk_mirror) to the output of the driver filter (CK_mirror1). Because Flip_mux2 is low, driver filter 307 supplies input clock signal GCLK at its output terminal (CK_mirror1), as described above. Therefore, delay line 301 now sees at its input terminal (C0) the input clock signal GCLK.

The DLL circuit is now in "operating" mode. The input clock signal GCLK enters the DLL circuit, and is routed through driver filter 307 and multiplexer 312 to delay line 301. Delay line 301 delays the input clock signal by the appropriate number of delays to ensure that the feedback clock FBCLK is synchronized to the input clock signal GCLK, then provides the appropriately delayed signal as output clock signal CLKOUT to the clock network 304.

After some predetermined number of clock cycles, for example at the seventeenth clock cycle, timer circuit 308 provides optional signal DLL_done, signifying that the clock synchronization process is complete. Signal DLL_done can be used, for example, to enable other circuits on the device that are controlled by the clock network.

Driver Filter

FIG. 5 shows one embodiment of a driver filter 307 that can be used with the embodiment of FIG. 3. Driver filter 307 comprises reset flip-flops 501–504, set flip-flops 505–508, NAND-gates 510–512, and inverters 520–523. Flip-flops 501–507 are coupled in series, with the data input (D) of flip-flop 501 driven by logic high (VDD), and the output (Q)

of each flip-flop driving the data input (D) of the next flip-flop in the series. The output (Q) of flip-flop 504 also drives inverter 523, the output of which supplies one input of NAND-gate 510. The other input of NAND-gate 510 is signal Flip_mux2. NAND-gate 510 supplies one input of NAND-gate 511. The other two inputs of NAND-gate 511 are supplied by flip-flop 507 and input clock signal GCLK. NAND-gate 511 supplies one input of NAND-gate 512, which supplies both the clock input of flip-flop 508 and DLL control signal Ck_mirror1. The other input of NAND-gate 512 is supplied by the output of flip-flop 508. The data input of flip-flop 508 is tied low (GND).

Input clock signal GCLK is also supplied to a first inverter 521, which supplies signal GCLKB. Signal GCLKB drives both the clock terminals of flip-flops 505–507 and a second inverter 522. The output of second inverter 522 supplies the clock signal to flip-flops 501–504. DLL control signal Flip_mux2 is inverted by inverter 520 to produce signal Flip_mux2B, which drives the reset terminals of flip-flops 501–504 and the set terminals of flip-flops 505–508.

The behavior of driver filter 307 was described above, in reference to FIG. 3.

Low Filter

FIG. 6 shows one embodiment of a low filter 309 that can be used with the embodiment of FIG. 3. Low filter 309 comprises reset flip-flops 601–605, set flip-flops 606–609, NAND-gates 611–612, and inverters 620–622. Flip-flops 601–608 are coupled in series, with the data input (D) of flip-flop 601 driven by logic high (VDD), and the output (Q) of each flip-flop driving the data input (D) of the next flip-flop in the series. The output (Q) of flip-flop 605 also supplies one input of NAND-gate 611. The other two inputs of NAND-gate 611 are supplied by flip-flop 608 and input clock signal GCLK. NAND-gate 611 supplies one input of NAND-gate 612, which supplies both the clock input of flip-flop 609 and DLL control signal Ck_mirror2. The other input of NAND-gate 612 is supplied by the output of flip-flop 609. The data input of flip-flop 609 is tied low (GND).

Input clock signal GCLK is also supplied to a first inverter 621, which supplies signal GCLKB. Signal GCLKB drives both the clock terminals of flip-flops 606–608 and a second inverter 622. The output of second inverter 622 supplies the clock signal to flip-flops 601–605. DLL control signal DLL_on is inverted by inverter 620 to produce signal DLL_onB, which drives the reset terminals of flip-flops 601–605 and the set terminals of flip-flops 606–609.

The behavior of low filter 309 was described above, in reference to FIG. 3.

Timer Circuit

FIG. 7 shows one embodiment of a timer circuit 308 that can be used with the embodiment of FIG. 3. Timer circuit 308 comprises reset flip-flops 701–712, NAND-gate 731, inverters 720–724, NOR-gates 741–742, and exclusive OR-gate (XOR-gate) 751. Flip-flops 701–709 are coupled in series, with the data input (D) of flip-flop 701 driven by logic high (VDD), and the output (Q) of each flip-flop driving the data input (D) of the next flip-flop in the series. The output (Q) of flip-flop 709 supplies optional control signal DLL_done. The output (Q) of flip-flop 703 also supplies one input of XOR-gate 751. The other input of XOR-gate 751 is DLL control signal DLL_on. XOR-gate 751 supplies DLL control signal Flip_mux2. DLL control signal DLL_on is also inverted by inverter 723, which drives the reset terminals of flip-flops 701–712. Flip-flops 701–712 also have disable terminals (or enable-bar terminals) ENB, which are driven by signal STOPB, signal STOP inverted by inverter 720. Flip-flops 701–712 are each clocked by signal GCLK, twice inverted by inverters 721 and 722 coupled in series.

The output (Q) of flip-flop 712 supplies one input of NAND-gate 731. The other input of NAND-gate 731 is DLL control signal Flip_mux2. NAND-gate 731 supplies one input of NOR-gate 741. The other input of NOR-gate 741 is signal STOP, and NOR-gate 741 generates control signal Reg_en. Control signal Flip_mux6 is provided by NOR-gate 742 from signal STOP and the inverse of signal Flip-mux2 (inverted by inverter 724).

The behavior of timer circuit 308 was described above, in reference to FIG. 3.

Those having skill in the relevant arts of the invention will now perceive various modifications and additions that may be made as a result of the disclosure herein. For example, the above text describes the invention in the context of ICs. However, the invention can also be applied to many other systems. Further, filters, clock networks, delay matching circuits, unit delays, delay lines, timer circuits, tristate buffers, memory elements, multiplexers, decoder circuits, and control circuits other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A delay-lock loop (DLL) circuit coupled to a clock network, the DLL circuit comprising:

an input clock terminal providing an input clock signal;

a feedback clock terminal providing a feedback clock signal from the clock network;

an output clock terminal providing an output clock signal to the clock network;

a delay line driven by the feedback clock signal in a first mode and by the input clock signal in a second mode;

a decoder circuit driven by the delay line;

a clock multiplexer circuit driven by the delay line and controlled by the decoder circuit, the clock multiplexer circuit providing the output clock signal to the output clock terminal; and a control circuit, wherein:

the control circuit controls a mode of the DLL circuit, in the first mode the delay line provides to the decoder circuit a plurality of first intermediate clock signals delayed from the feedback clock signal by incremental unit delays, and in the second mode the delay line provides to the clock multiplexer circuit a plurality of second intermediate clock signals delayed from the input clock signal by the incremental unit delays.

2. The DLL circuit of claim 1, wherein:

the delay line comprises a series of unit delays; and in the second mode, the output clock signal is delayed from the input clock signal by a number of unit delays closest to but not exceeding an additional delay needed to bring the feedback clock signal into synchronization with the input clock signal.

3. The DLL circuit of claim 1, wherein:

the delay line comprises a series of unit delays; and in the second mode, the output clock signal is delayed from the input clock signal by a number of unit delays closest to and exceeding an additional delay needed to bring the feedback clock signal into synchronization with the input clock signal.

4. A method of synchronizing a feedback clock signal from a clock network with an input clock signal, the method comprising:

provi­ding from the feedback clock signal in a first mode a plurality of first intermediate clock signals delayed from the feedback clock signal by incremental unit delays;

transitioning from the first mode to a second mode;

providing from the input clock signal in the second mode a plurality of second intermediate clock signals delayed from the input clock signal by the incremental unit delays;

selecting, based on the first intermediate clock signals, from among the second intermediate clock signals a selected clock signal, the selected clock signal being an intermediate clock signal subject to a selected delay about equal to an additional delay needed to bring the feedback clock signal into synchronization with the input clock signal; and providing the selected clock signal to the clock network.

5. The method of claim 4, wherein the selected delay comprises a number of unit delays closest to but not exceeding the additional delay needed to bring the feedback clock signal into synchronization with the input clock signal.

6. The method of claim 4, wherein the selected delay comprises a number of unit delays closest to and exceeding the additional delay needed to bring the feedback clock signal into synchronization with the input clock signal.

7. A delay-lock loop (DLL) circuit coupled to a clock network, the DLL circuit comprising:

means for receiving a feedback clock signal from the clock network;

means for receiving an input clock signal;

means for providing from the feedback clock signal in a first mode a plurality of first intermediate clock signals delayed from the feedback clock signal by incremental unit delays;

means for transitioning from the first mode to a second mode;

means for providing from the input clock signal in the second mode a plurality of second intermediate clock signals delayed from the input clock signal by the incremental unit delays;

means for selecting, based on the first intermediate clock signals, from among the second intermediate clock signals a selected clock signal, the selected clock signal being an intermediate clock signal subject to a selected delay about equal to an additional delay needed to bring the feedback clock signal into synchronization with the input clock signal; and means for providing the selected clock signal to the clock network.

8. The DLL circuit of claim 7, wherein the selected delay comprises a number of unit delays closest to but not exceeding the additional delay needed to bring the feedback clock signal into synchronization with the input clock signal.

9. The DLL circuit of claim 7, wherein the selected delay comprises a number of unit delays closest to and exceeding the additional delay needed to bring the feedback clock signal into synchronization with the input clock signal.

10. The DLL circuit of claim 7, wherein the means for providing a plurality of first intermediate clock signals comprises means for storing the first intermediate clock signals.

11. The DLL circuit of claim 10, wherein the means for storing the first intermediate clock signals comprises a series of latches.

* * * * *